United States Patent

Tan

(10) Patent No.: US 7,376,524 B2
(45) Date of Patent: May 20, 2008

(54) TRANSITION-DENSITY BASED TIME MEASUREMENT METHOD

(75) Inventor: Kan Tan, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 341 days.

(21) Appl. No.: 11/083,612

(22) Filed: Mar. 17, 2005

(65) Prior Publication Data

US 2005/0234668 A1  Oct. 20, 2005

Related U.S. Application Data

(60) Provisional application No. 60/562,790, filed on Apr. 16, 2004.

(51) Int. Cl.
*G01R 13/00* (2006.01)
*H03D 1/06* (2006.01)

(52) U.S. Cl. .......................................... 702/69; 375/348

(58) Field of Classification Search ................ 702/69, 702/79, 66, 67, 57; 375/346–348, 226, 360–362, 375/355, 364, 376; 324/612–613, 620
See application file for complete search history.

(56) References Cited

U.S. PATENT DOCUMENTS

| | | | | |
|---|---|---|---|---|
| 4,780,893 A | * | 10/1988 | Henkelman, Jr. ........... 375/376 |
| 5,276,712 A | * | 1/1994 | Pearson ....................... 375/360 |
| 5,309,483 A | * | 5/1994 | Oliboni et al. .............. 375/355 |
| 5,761,254 A | * | 6/1998 | Behrin ........................ 375/355 |
| 5,949,357 A | * | 9/1999 | Fitzpatrick et al. ........... 341/68 |
| 6,137,850 A | * | 10/2000 | Miller ......................... 375/354 |
| 6,718,497 B1 | * | 4/2004 | Whitby-Strevens .......... 714/739 |
| 7,058,872 B1 | * | 6/2006 | Whitby-Strevens .......... 714/739 |
| 7,173,995 B2 | * | 2/2007 | Karlquist ...................... 375/376 |

OTHER PUBLICATIONS

Choi et al., Hybrid Time-Stamped Transition Density for the Estimation of Delay-Dependent Switching Activities, 1997 IEEE, pp. 1030-1033.*
Million et al., Effects of Symbol Transition Density on the Performance of the Data Transition Tracking Loop at Low Signal-to-Noise Ratios, 1995 IEEE, pp. 1036-1040.*
Mileant et al., The Performance of the All-Digital Data Transition Tracking Loop Using Nonlinear Analysis, IEEE Transactions on Communications, vol. 43, No. 2/3/4, Feb./Mar./Apr. 1995, pp. 1202-1215.*

* cited by examiner

*Primary Examiner*—John Barlow
*Assistant Examiner*—Toan M. Le
(74) *Attorney, Agent, or Firm*—Francis L. Gray; Thomas F. Lenihan

(57) ABSTRACT

A transition-density based data timing measurement method uses an estimated transition density (TD) value for an acquired data signal together with edge crossing times to estimate a data period for the acquired data signal. The estimated data period is used for symbol classification to determine a number of bits between adjacent edge crossings, which results are used to adjust the TD value. The adjusted TD value is then used to re-compute the data period.

3 Claims, 2 Drawing Sheets

TRANSITION-DENSITY BASED TIME MEASUREMENT METHOD

CROSS REFERENCE TO RELATED APPLICATION

The subject application claims priority from U.S. Provisional Patent Application Ser. No. 60/562,790 (Kan TAN), filed 16 Apr. 2004, entitled TRANSITION-DENSITY BASED TIME MEASUREMENT METHOD, and assigned to the same assignee as the subject application.

BACKGROUND OF THE INVENTION

The present invention relates to data signal time measurements, and more particularly to a transition-density based time measurement method.

In a high-speed data transfer system it is not uncommon for a data signal to have a large amount of inter-symbol interference (ISI) and other forms of jitter at a receiver. When the jitter on the data signal occupies a significant percentage of the data period, accurate time measurements are a challenging task. This happens infrequently in low-speed systems, but is not unusual in high-speed systems.

When the data signal has a large amount of jitter, which could be ISI, periodic jitter (PJ), duty-cycle-distortion (DCD), random jitter (RJ) or a combination of these jitter components, the data time measurement method based on pattern match, as described in U.S. Pat. No. 6,356,850 entitled "Method and Apparatus for Jitter Analysis" by WaveCrest Corporation, has difficulty making a correct pattern match because of the high noise level. Getting a good estimation of the data period for the pattern match algorithm to start with is also difficult in this case. Another data time measurement method is based on a pulse width histogram. This method estimates the data period from samples around the first significant pulse in a histogram of pulse widths under the assumption that these samples represent a width of one unit interval. The histogram-based method has difficulty avoiding bias when the data signal has large jitter, particularly large ISI.

Both methods are based on variables that may be significantly affected by jitter. Pattern match methods need to know the specific bit sequence of the pattern. For a 23-bit pseudo-random binary sequence (PRBS) with a pattern length of roughly eight million, pattern match is quite expensive computationally.

Transition-Density (TD) is the probability of a transition occurring. Normally TD may be seen as the average transition density. Data streams used in real data communications systems typically have a transition density of 50%— see "Fibre Channel —Methodologies for Jitter and Signal Quality Specification—MJSQ", Technical Committee T11 of the International Committee for Information Technology Standards, Project 1316-DT.

What is desired is a data time measurement method that provides accurate time measurement on non-return-to-zero (NRZ) data signals that have large jitter.

BRIEF SUMMARY OF THE INVENTION

Accordingly the present invention provides a transition-density (TD) based time measurement method based on the observation that the TD value of a signal is not affected by jitter. Edge crossing times for an acquired data signal are found, and an estimated data period is determined based on such edge crossing times and an initial estimate of the TD value for the data signal. Symbol classification is performed using the estimated data period and edge crossing times to provide a run length array representing the number of bits between adjacent edge crossing times. The TD value is then adjusted and the data period is re-calculated using the adjusted TD value. If a difference between the adjusted and previous TD values is greater than a predetermined value, the data period is estimated again using the adjusted TD value in lieu of the initial TD value. The process is repeated until the difference is less than the predetermined value. Then the data period is re-calculated using the latest version of the adjusted TD value.

The objects, advantages and other novel features of the present invention are apparent from the following detailed description when read in conjunction with the appended claim and attached drawing.

DETAILED DESCRIPTION OF THE INVENTION

Figure 1:
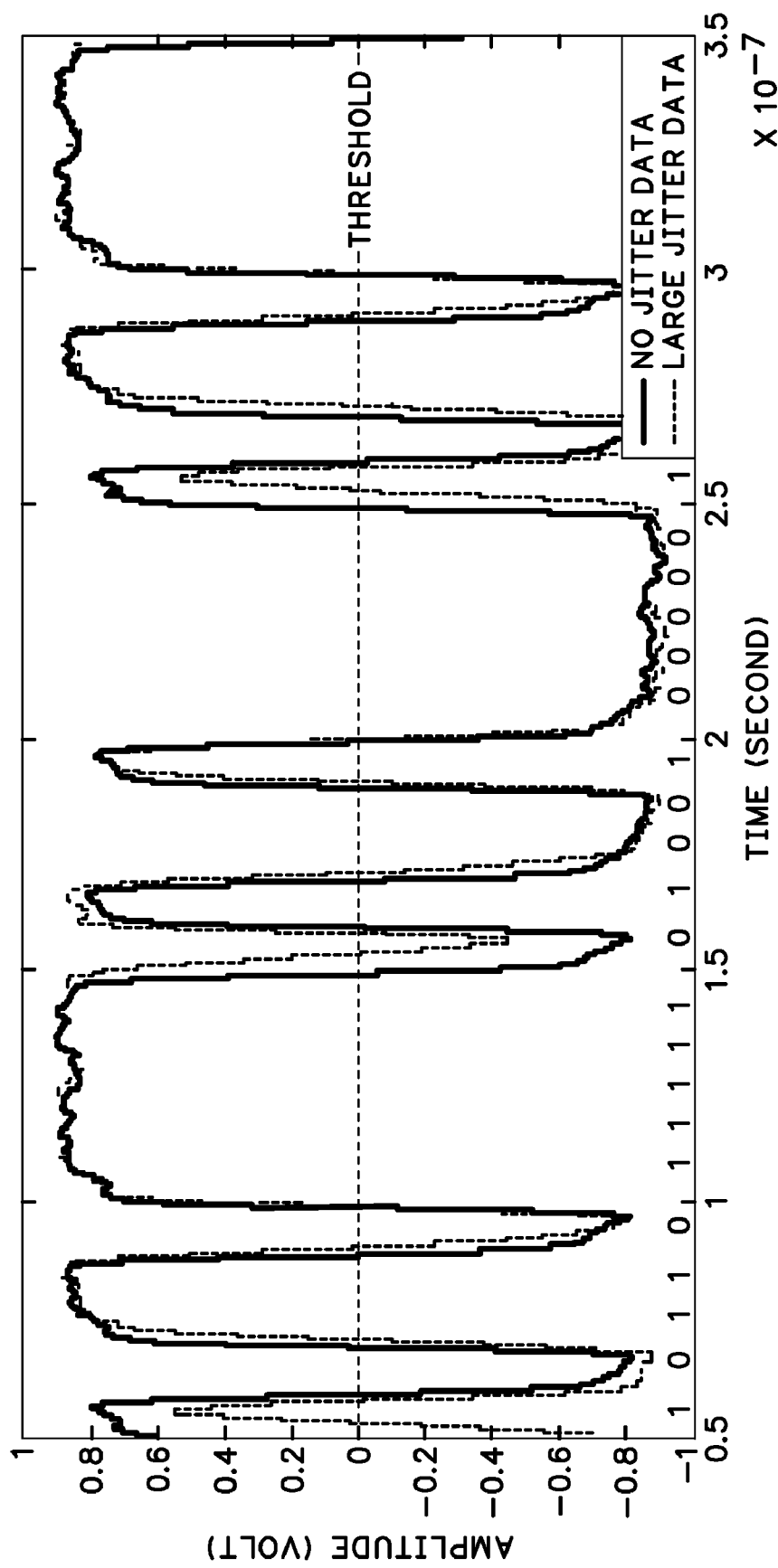
FIG. 1 is a graphic diagram view of a comparison between a signal with and without jitter.

Referring now to FIG. 1 a nominal signal with no jitter, indicated by a solid line, is compared to the signal with jitter, indicated by a dotted line. The jittered signal is driven by the same clock as the nominal signal, but has crossing edges deviating significantly from the nominal signal. A Transition-Density (TD) value is the same for both signals, so an accurate measurement of data period relative to the period of the driving clock may be made based on the TD value. In most test scenarios the TD of the data stream is known or may be estimated closely using general knowledge of the signal. When the data pattern is known, the TD value may be calculated explicitly. For example among the widely used testing data sequences for various serial data standards— Fibre Channel, XAUI (10 Gbps attachment unit interface), etc.—K28.5− (0011111010) and K28.5+ (1100000101) when concatenated (K28.5−, K28.5+, K28.5−, K28.5+) has a TD of 50%, K28.7 (the clock-like pattern having transitions on each clock edge) has a TD of 100%, an alternating sequence of K28.5 and K28.7 characters has a TD of 75%, and CJPAT (continuous jitter pattern test) and all PRBS sequences have a TD of 50%. For an unknown, but assumed to be random, data stream 50% is a good estimation for TD. TD is an important parameter of the data stream: many phase locked loop (PLL) circuits performing clock data recovery (CDR) have an effective bandwidth that is dependent upon the TD of the data stream.

After the data period is initially estimated and symbol classification is performed, the TD value has to be adjusted. This is because the estimated TD value may not be accurate, and even a known TD value may require adjustment if the acquired data doesn't contain an integral number of copies of a repeated pattern. The effective TD value is computed after the symbol classification result is available. Correct symbol classification is critical for data time measurements.

Figure 2:
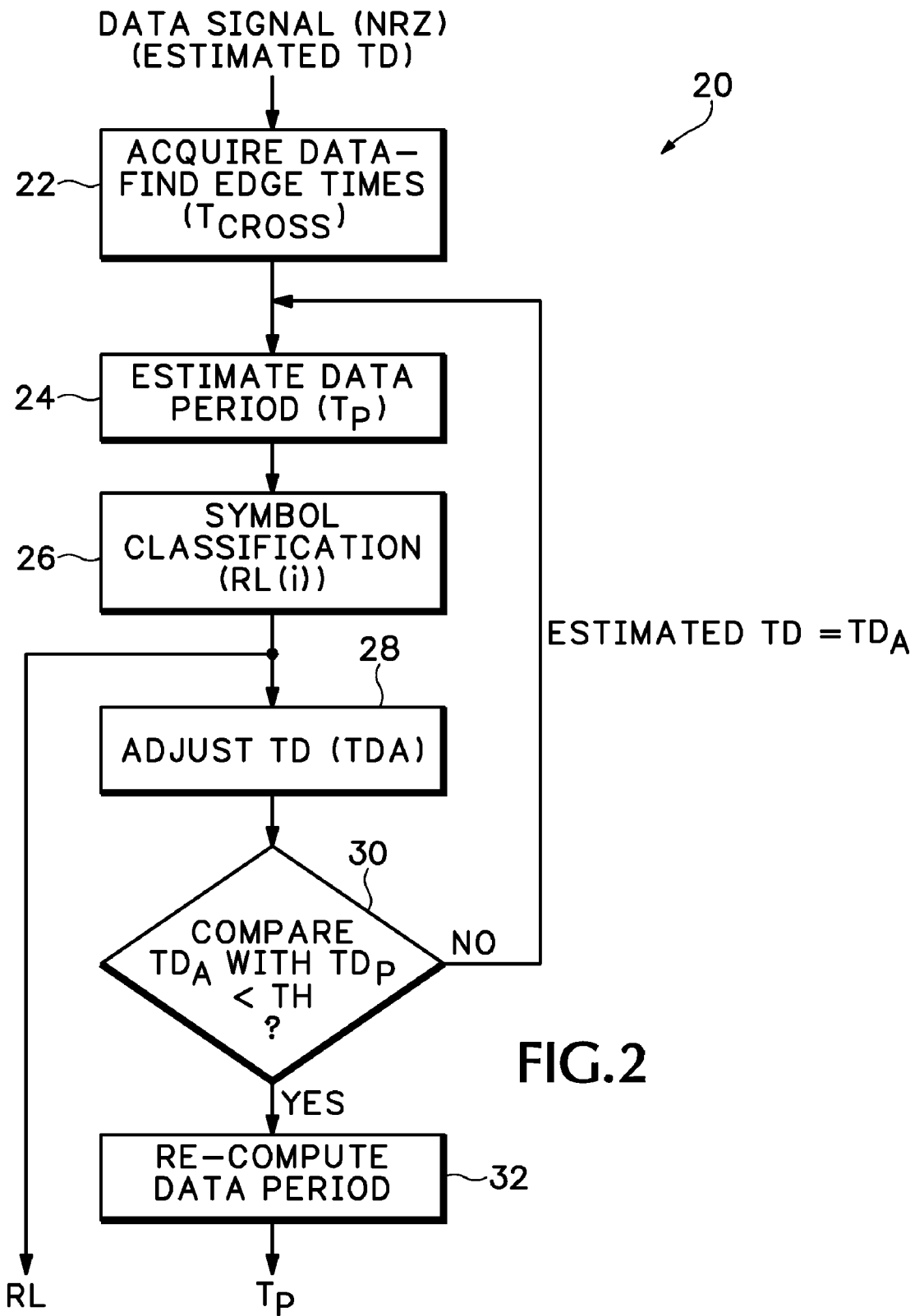
FIG. 2 is a flow chart view of a TD based time measurement method according to the present invention.

The TD based data time measurement method 20 has the following steps, as shown in FIG. 2:

1. Acquire a sample of the signal representing temporally contiguous data bits using an oscilloscope or other acquisition instrument. Within this sample find the edge crossing times (transition times) Tcross(i), i=1, 2, ..., N, corresponding to where the signal crosses a chosen decision threshold. (Step 22)

2. Estimate the data period Tp using the following formula:

$$Tp=TDx(Tcross(N)-Tcross(1))/(N-1) \quad (1)$$

where (N−1)/TD gives an estimated number of bits between the starting edge time and ending edge time, and TD is an estimated initial value for the acquired signal. (Step 24)

3. Perform symbol classification to estimate the number of like bits (run length, RL(i), i=1, 2, ..., N−1) between adjacent edges. There are various methods available. Variations include whether the clock recovery is based on a constant-clock assumption or via a phase locked loop, and may use knowledge of the actual data pattern if the pattern is known. One simple way is using the following formula:

$$RL(i)=round((Tcross(i+1)-Tcross(i))/Tp) \; i=1, 2, \ldots, N-1$$

If for some i, RL(i)=0, then set RL(i)=1 and adjust RL(i−1) and RL(i+1) such that:

$$RL(i-1)+1+RL(i+1)=round((Tcross(i+2)-Tcross(i=1$$

(Step 26)

4. Calculate an adjusted TD value from the array of run lengths:

$$\text{adjusted } TD=(N-1)/\Sigma_{i=1-(N-1)}RL(i)$$

(Step 28)

5. Compare the adjusted TD value ($TD_A$) with the previous TD value ($TD_P$). The difference may be computed in relative or absolute value. If the difference is small enough (<TH), proceed to step 32, otherwise go back to step 24 using the adjusted TD in lieu of the initial estimated TD. (Step 30)

6. Re-compute the data period using formula (1). Other data time measurements may be done based on the symbol classification results from step 26. The estimated data period and symbol classification results may also be used to initialize a software PLL to do clock recovery. (Step 32)

The threshold (TH) for the difference, for example using a relative value, may be set at 5% so that, if the difference between $TD_A$ and $TD_P$ is greater than 5%, the $TD_A$ is further refined, otherwise the $TD_A$ is used to determine the measured data period.

Thus the present invention provides a transition-density based data time measurement method for acquired data by finding edge crossing times for the data having an initial estimated TD value, estimating a data period from the edge crossing times and the initial TD value, determining bit run lengths between adjacent edges, adjusting the TD value based on the run lengths, and re-computing the data period using the adjusted TD value.

What is claimed is:

1. A method of data time measurement using transition-density comprising the steps of:
    finding edge crossing times for acquired data;
    estimating a data period from the edge crossing times and an estimated transition density value for the acquired data;
    performing symbol classification from the edge crossing times and the estimated data period to produce an array of bit run length values;
    adjusting the estimated transition density value from the bit run length values to produce an adjusted transition density value; and
    re-calculating the data period as in the estimating step using the adjusted transition density value to produce a measured data period.

2. The method as recited in claim 1 further comprising the steps of:
    comparing the adjusted transition density value with a previous transition density value prior to the re-calculating step; and
    repeating the estimating, performing, adjusting and comparing steps when a difference between the adjusted transition density value and the previous transition density value is greater than a predetermined value, using the adjusted transition density value as the estimated transition density value.

3. The method as recited in claim 2 wherein the difference comprises one selected from the group consisting of an absolute difference and a relational difference.

* * * * *